United States Patent [19]

Yano et al.

[11] Patent Number: 4,895,107
[45] Date of Patent: Jan. 23, 1990

[54] PHOTO CHEMICAL REACTION APPARATUS

[75] Inventors: Kensaku Yano, Kanagawa; Akihiko Furukawa, Tokyo; Ryohei Miyagawa, Kanagawa; Yoshinori Iida, Tokyo, all of Japan

[73] Assignee: Kabushiki Kaisha Toshiba, Kanagawa, Japan

[21] Appl. No.: 215,175

[22] Filed: Jul. 5, 1988

[30] Foreign Application Priority Data

Jul. 6, 1987 [JP] Japan ................... 62-168028

[51] Int. Cl.⁴ ........................................... C23C 16/00
[52] U.S. Cl. ..................... 118/722; 118/719; 118/729; 156/345; 427/54.1
[58] Field of Search ............ 118/50.1, 719, 723, 118/729, 722; 427/53.1, 54.1, 248.1; 156/345, 646

[56] References Cited

U.S. PATENT DOCUMENTS

| | | | |
|---|---|---|---|
| 4,042,128 | 8/1977 | Shrader | 118/719 |
| 4,047,624 | 9/1977 | Dorenbos | 118/719 |
| 4,274,936 | 6/1981 | Love | 118/719 |
| 4,313,254 | 2/1982 | Feldman et al. | 118/719 |
| 4,654,226 | 3/1987 | Jackson et al. | 118/719 |
| 4,781,511 | 11/1988 | Harada et al. | 118/729 |

FOREIGN PATENT DOCUMENTS

| | | | |
|---|---|---|---|
| 3415012 | 1/1986 | Fed. Rep. of Germany | 118/723 |
| 221572 | 11/1985 | Japan | 118/719 |
| 1110772 | 5/1986 | Japan | 118/719 |
| 3125680 | 5/1988 | Japan | 118/722 |

Primary Examiner—Richard Bueker
Assistant Examiner—Terry J. Owens
Attorney, Agent, or Firm—Finnegan, Henderson, Farabow, Garrett and Dunner

[57] ABSTRACT

A photo chemical reaction apparatus comprises a vacuum container partitioned into a reaction chamber and a carrier chamber by use of partition board. The partition board has an opening into which a carrier tray can be detachably inserted so as to cause the rection chamber to be hermetically sealed. The carrier tray has a substrate holder opposite to a light-penetrating window. A reaction gas flows between this window and a substrate to be processed mounted on the substrate holder.

12 Claims, 3 Drawing Sheets

PHOTO CHEMICAL REACTION APPARATUS

BACKGROUND OF THE INVENTION

1. Field of the invention:

This invention relates to a photo chemical reaction apparatus such as a photo chemical vapor deposition apparatus, and more particularly to a photo chemical reaction apparatus using a load-lock mechanism in which a reaction chamber is sealed continuously against atmospheric pressure during the process of manufacturing semiconductors.

2. Description of the Prior Art:

In recent years, along with the progress of semiconductor integrated circuits, miniaturization and higher integration of semiconductor elements have been required. To meet these requirements, a photo excited process has become of major interest. This photo excited process is one of the low-temperature processes for manufacturing semiconductors intended to avoid possible damage caused by high-temperature processing. Hitherto, a photo chemical vapor deposition apparatus (hereinafter, simply referred to as photo CVD apparatus) has utilized the photo excited process. This apparatus includes a vacuum container in which wafers to be processed are disposed, means for introducing gases into the container, and means for applying light on the wafers through a light-penetrating window provided at a portion of the container. Application of ultraviolet rays or the like causes the surface of the wafers to be excited together with gases. This excitement achieves deposition of CVD films on the wafers.

However, in a photo CVD apparatus, while CVD films are being deposited on the wafers to be processed, the same thin film is inevitably being deposited also on the lightpenetrating window. The thin film deposited on this window causes a decrease in the amount of incident light into the vacuum container. Thus, the film growth rate of the CVD films on the wafers decreases significantly. In order to solve this problem, two countermeasures have been considered. In one technique, oil of a fluorine group is applied to the light-penetrating window prior to the processing. In the other technique, so-called "purging", in which $N_2$ gas is blown on the window, is carried out.

However, such oil is apt to be mixed into the CVD film as an impurity. Further, the deposition of thin films on the window cannot be completely prevented even after the oil is applied to the window. Moreover, to achieve proper blowing of $N_2$ gas, the window should have minute holes from which $N_2$ gas flows out. This flow creates a layer flow of $N_2$ gas on the surface of the window. The flow of $N_2$ gas may also be created in the lateral direction on the window surface. However, the flow inevitably requires a window of complicated construction. In addition, the gas is diluted with such flow of $N_2$ gas. Thus, the growth rate of deposition decreases.

For example, in the case of the mass production of amorphous silicon devices, the deposition of amorphous silicon film on the window cannot be sufficiently prevented even when the oil of a fluorine group is applied to the window. Further, unlike other insulating films, the amorphous silicon film absorbs a large amount of light. Specifically, while the CVD film of amorphous silicon of about 3 $\mu$m thickness is created on the wafer, an amorphous silicon film of about 200 to 300 Å is inevitably deposited on the window even after the oil is applied thereto. This deposition on the window causes a decrease in the amount of light of about 20%.

These phenomena are disadvantageous, particularly to the mass production of semiconductor elements for which thick films are indispensable. Moreover, in order to clean the film-deposited window, a reaction chamber must be opened to atmospheric pressure after completion of each single batch processing. This opening to atmospheric pressure for each batch causes significant problems in manufacturing semiconductor elements having a multi-layer configuration.

As described above, in the conventional photo CVD apparatus, there have been problems in that the thin film deposited on the light-penetrating window causes a decrease in the amount of incident light. Thus, the rate of film formation decreases significantly. Therefore, continuous formation of the CVD film by use of the load-lock mechanism cannot be realized. Further, these disadvantages have become serious problems not only in the photo CVD apparatus, but also in a photo etching apparatus, for example.

SUMMARY OF THE INVENTION

Accordingly, one object of this invention is to provide a photo chemical reaction apparatus capable of massproducing amorphous silicon devices having a multi-layer configuration by virtue of preventing a decrease in the amount of incident light caused by the thin film deposited on the light-penetrating window.

Briefly, in accordance with one aspect of this invention, there is provided a photo chemical reaction apparatus that chemically processes substrates by application of light. The apparatus comprises a carrier tray which includes a light-penetrating window disposed inside a frame, a substrate holder disposed on opposite side of the light-penetrating window by use of supporting members from the frame in such a manner that a reaction gas flows between the holder and the light-penetrating window. The apparatus also comprises a vacuum container which includes a reaction chamber having reaction gas introducing means and reaction gas exhausting means, a carrier chamber partitioned from the reaction chamber with a partition board having an opening, the carrier chamber having therein a light-applying member adjustable in a light-applying direction. The apparatus further comprises another vacuum container connected through a gate valve to the carrier chamber.

BRIEF DESCRIPTION OF THE DRAWINGS

A more complete appreciation of the invention and many of the attendant advantage thereof will be readily obtained as the same becomes better understood by reference to the following detailed description when considered in connection with the accompanying drawings wherein.

DESCRIPTION OF THE PREFERRED EMBODIMENTS

Figure 1:
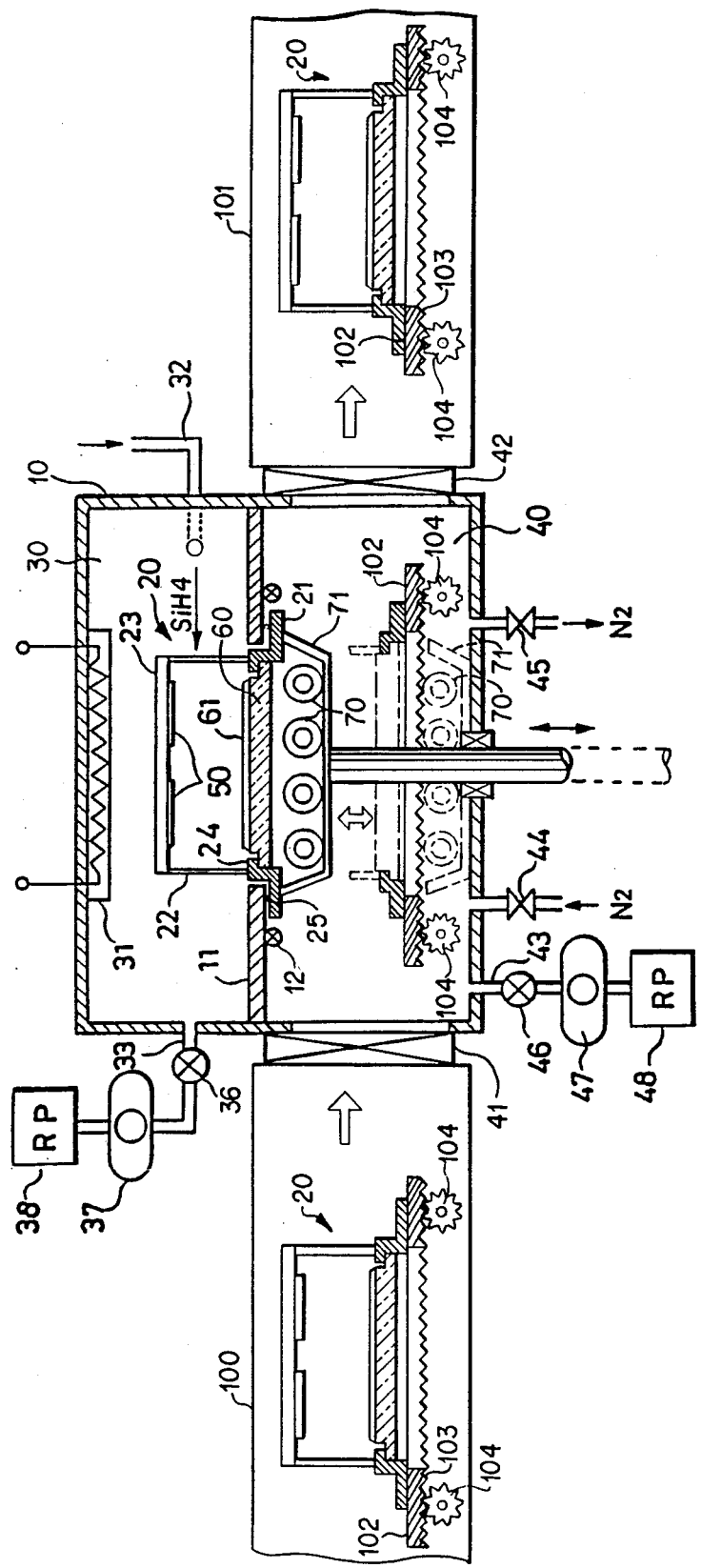
FIG. 1 is a cross-sectional view illustrating an essential portion of a photo chemical reaction apparatus according to a first embodiment of the present invention.

Referring now to the drawings, wherein like reference numerals designate identical or corresponding parts throughout the several views, and more particularly to FIG. 1 thereof, a first embodiment of this invention will be described.

In FIG. 1, a container 10 is partitioned into an upper reaction chamber 30 and a lower carrier chamber 40 by use of a partition board 11 and a cassette-type carrier tray 20.

Figure 2:
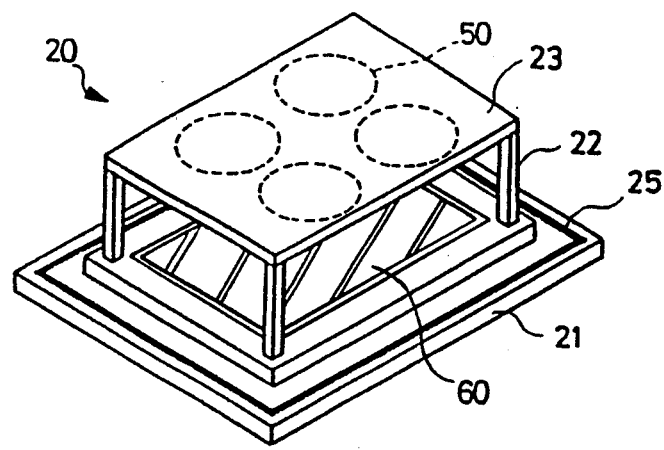
FIG. 2 is a perspective view illustrating a cassettetype carrier tray shown in FIG. 1.

The carrier tray 20 includes, as shown in the perspective view of FIG. 2, a substrate holder 23 secured fixedly through metal rods 22 onto a metal supporting plate 21 having a rectangular opening. A plurality of wafers 50 are secured on the lower surface of the substrate holder 23 as substrates to be processed. A light-penetrating window 60 is secured on the lower surface of the metal supporting plate 21 through an O-ring seal 24. The carrier tray 20 with the substrate holder 23 turned upward is secured to the partition board 11 in such a manner as follows. The upper surface of the metal supporting plate 21 is pressed against the partition board 11 through an O-ring seal 25. This construction causes the reaction chamber 30 to be hermetically sealed from the carrier chamber 40. The light-penetrating window 60 is of a synthetic quartz plate that allows ultraviolet rays to penetrate. Oil of a fluorine group is applied to the upper surface of the window 60. A cooling water pipe 12 is provided on the lower surface of the partition plate 11 in order to refrigerate the O-ring seal 25.

A sheath heater 31 is disposed on the inner wall of the upper portion of the reaction chamber 30. This heater 31 heats the wafers 50 secured on the carrier tray 20 up to the optimum temperature for film formation. The reaction chamber 30 is provided with a gas introducing pipe 32 and a gas exhausting pipe 33. A material gas such as $SiH_4$ is introduced into the reaction chamber 30 through the pipe 32. The gas within the reaction chamber 30 is exhausted through the pipe 33. Other vacuum containers 100 and 101 are connected to both sides of the carrier chamber 40 through gate valves 41 and 42. The carrier tray 20 is moved in the direction from the vacuum container 100 to the carrier chamber 40 to the vacuum container 101 through the gate valves 41 and 42.

The vacuum containers 100 and 101 are the same as the vacuum container 10 in construction, or they may also serve as preparatory containers that contain a plurality of cassette-type carrier trays 20. Specifically, when plural apparatus which are the same as the vacuum container 10 are connected in series, one single tray 20 is moved from a carrier chamber to a neighboring carrier chamber. In the respective apparatus, processes of CVD using different materials in serial processing can be performed continuously. Further, in the case where a large number of trays 20 are waiting in preparatory containers, a large number of processes of the same CVD process can be performed uninterruptedly.

In the bottom portion of the carrier chamber 40, a plurality of low-voltage mercury-vapor lamps (light sources) 70 that emit ultraviolet rays are disposed on a lamp stand 71. These light sources 70 and the stand 71 are movable up and down in a vertical line. Thus, they can be moved out of the way when the carrier tray 20 is carried into or from the carrier chamber 40. The carrier chamber 40 is connected with a gas introducing valve 44 that introduces $N_2$ gas thereinto, and also with a gas exhausting valve 45 that exhausts $N_2$ gas therefrom. Further, the carrier chamber 40 is provided with an exhausting system that includes an exhaust pipe 43, an exhaust valve 46, a turbopump 47, and a rotary pump 48. Similarly, the reaction chamber 30 is provided with an exhausting system that includes an exhaust pipe 33, an exhaust valve 36, a turbopump 37, and a rotary pump 38.

Next, the operation of the above-described apparatus will be described.

In FIG. 1, the carrier tray 20 placed on a carriage 102 is carried from the vacuum container 100 into the carrier chamber 40 through the gate valve 41. In this state, the reaction chamber 30 and the carrier chamber 40 are exhausted to a vacuum by the respective exhausting system. The carriage 102 is a frame-shaped structure having an opening at its center. The both sides of carriage 102 are provided with gear driven arrangements including racks 102 and pinions 103. These pinions 103 serve as driving gears to move the carriage 102. When the carriage 102 is moved into the carrier chamber 40, the lamp stand 71 is at its lowest position as shown by the dotted line. The movement of carriage 102 is stopped when its opening coincides with the position of lamp stand 71. Thereafter, the lamp stand 71 is raised so as to lift the carrier tray 20 placed on the carriage 102. The carrier tray 20 is then inserted into an opening of the partition board 11.

After the above-described procedures, the carrier tray 20 is supported by the lamp stand 71 as shown by the solid line in FIG. 1. Next, the reaction chamber 30 is assuredly separated from the carrier chamber 40 in the following manner. In this state, there is substantially no difference in pressure between the reaction chamber 30 and the carrier chamber 40. Thus, the carrier tray 20 is not sealed tightly against the partition 11. The exhaust valve 46 is closed, and the valve 44 is opened so as to introduce an inert gas, such as $N_2$ gas, into the carrier chamber 40. As a result of this, the pressure within the carrier chamber 40 increases substantially to atmospheric pressure. The $N_2$ gas is exhausted by opening the valve 45, and is discarded into an exhausted gas processing system. The difference in pressure between the respective chambers 30 and 40 is increased by a series of the above-described procedures. As a result, the carrier tray 20 is strongly pressed against the partition board 11. Consequently, the reaction chamber 30 and the carrier chamber 40 are hermetically sealed, and completely isolated. When the amount of exhausting $N_2$ gas is properly controlled, this can also serves to refrigerate the light-penetrating window.

Next, to obtain a predetermined distance between the wafers 50 and the mercury-vapor lamps 70, the lamp stand 71 is adjusted in height.

In order to perform film of formation, $SiH_4$ gas of 0.1 to 1 Torr is introduced into the reaction chamber 30 through a pipe 32, and the mercury-vapor lamps are turned on. A luminous intensity of about 1 $mW/cm^2$ on the wafers 50 achieves the formation of an amorphous silicon film at a deposition rate of 2 to 3 Å/sec.

The apparatus of this embodiment has primarily two advantages in construction.

(1). The wafers 50 and the light-penetrating window 60 are combined and maintained continuously sealed to the atmosphere during processing.

(2). The carrying route of these passes through the carrier chamber 40.

Specifically, in advantage (1), since the wafers 50 and the window 60 do not need to be individually carried, the carrier mechanism thereof becomes simplified. Further, the window 60 can be taken out of the container together with the wafers 50 after completion of each single batch processing. Thus, the conditions of film formation are all the same in every process. With advantage (2), a substantially perfect hermetic seal can be readily obtained between the reaction chamber 30 and the carrier chamber 40.

Therefore, the $SiH_4$ gas within the reaction chamber 30, which is poisonous gas, can be assuredly prevented from leaking out to the carrier chamber 40. This also protects the mercury-vapor lamps 70 from adhesion of amorphous silicon film. Thus, a decrease in the amount of light of the lamp 70 can be prevented. Further, the construction of the reaction chamber 30 becomes simplified, so that the cubic volume thereof can be minimized. As a result, the quantity of gas released from the wall of the reaction chamber 30 decreases. Thus, a high degree of vacuum can be relatively easily obtained. This substantially protects the amorphous silicon film from a mixture of impurities. Thus, formation of a film of good quality can be realized.

As described above, according to this embodiment, the wafers 50 and the light-penetrating window 60 are united into a cassette-type carrier tray 20, and the tray 20 is carried into the carrier chamber 40. Thus, even when amorphous silicon films adhere to the window 60 after the process of one single batch, the tray 20 can be taken out so as to be cleaned independently. Namely, a decrease in amount of incident light caused by the film adhesion to the window 60 can be nipped in the bud before the subsequent batch process is performed. Therefore, the load-lock mechanism of plural chambers can be maintained. As a result, continuous batch processing can be readily achieved. Consequently, the mass production of multi-layer amorphous silicon devices can be realized.

Figure 3:
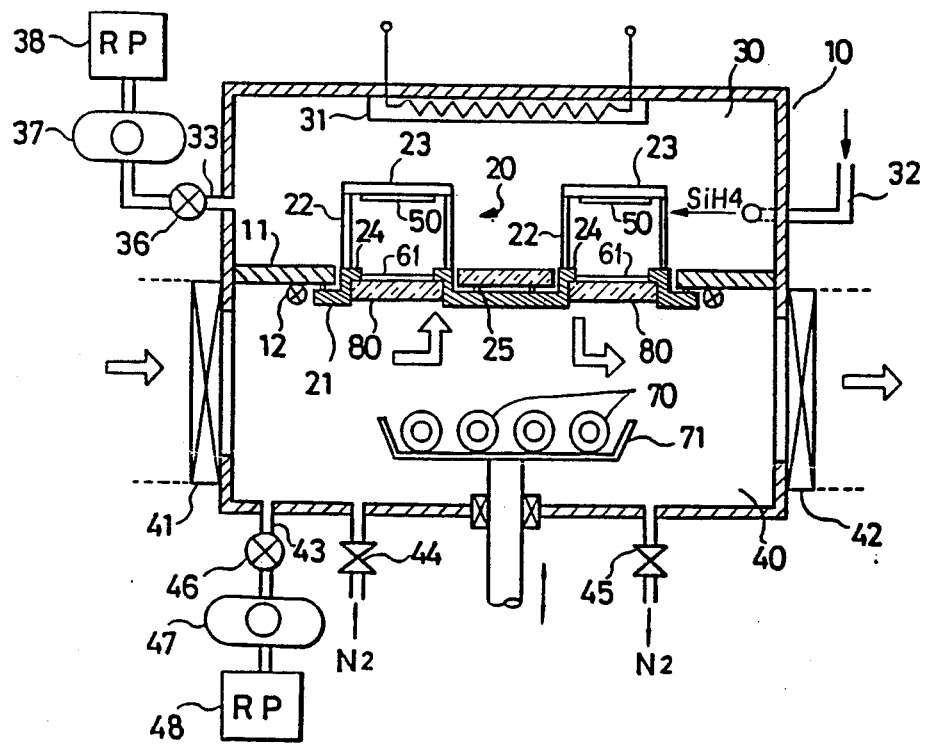
FIGS. 3 and 4 are cross-sectional views illustrating essential portions of photo chemical reaction apparatus according to second and third embodiments of the present invention.

FIG. 3 is a cross-sectional view illustrating a schematic configuration of a second embodiment according to the present invention.

This embodiment differs from the first embodiment in that the light-penetrating window 60 is divided into plural windows. In the case where a large number of wafers are processed, if the cassette-type carrier tray 20 in FIG. 2 is used, a quartz board of a large diameter becomes necessary as a light-penetrating window. However, when it becomes of a large diameter, its mechanical strength should be considered. As a result, a thicker quartz board is necessary. A thick quartz board is undesirable because of its weight, and because it decreases the amount of incident light. This embodiment is devised to cope with these problems. Specifically, a plurality of quartz windows (light-penetrating windows) 80 and wafers to be processed 50 are united into a cassette-type carrier tray 20. A partition board 11 is provided with a plurality of openings formed corresponding to the sizes of wafers 50. When the tray 20 is carrier into a carrier chamber 40 and disposed as shown in FIG. 3, a reaction chamber 30 becomes separated and hermetically sealed.

In the above-described construction, the same advantages as those in the first embodiment can be naturally obtained. Moreover, the light-penetrating window 80 can be smaller in size. Thus, the degree of freedom with respect to the window 80 increases.

Figure 4:
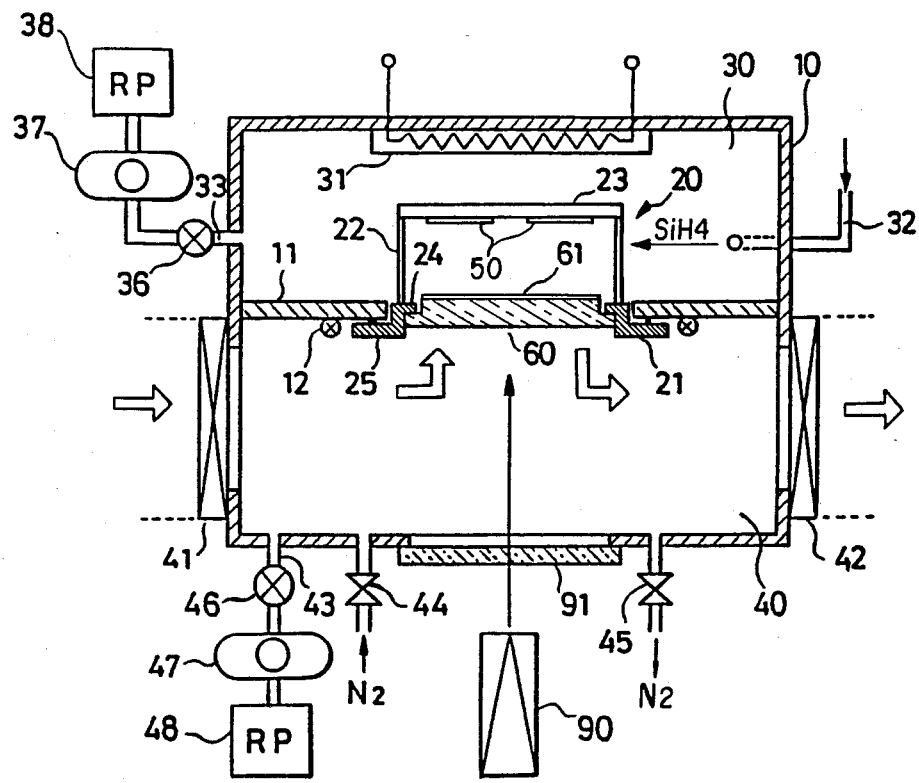

FIG. 4 is a cross-sectional view illustrating a schematic configuration of a third embodiment according to the present invention.

This embodiment differs from the first embodiment in that a laser light source is used in place of the lowvoltage mercury-vapor lamps 70 within the carrier chamber 40. Specifically, a light-penetrating window 91 is provided in the bottom portion of the carrier chamber 40. Under this window 91, an ArF excimer laser light source 90 is disposed. In this embodiment, $Si_2H_6$ gas is used instead of $SiH_4$ gas, in order to form an amorphous silicon film.

In the above-described construction, the same advantages as those in the first embodiment can be naturally obtained.

Moreover, this invention is not limited to the above-mentioned embodiments. In the respective embodiments, the formation of amorphous silicon films has been described as an example. However, these embodiments can also be applied to the cases where thin films of metals such as aluminum, cadmium, zinc, tin, and selenium are formed by a photo CVD apparatus using alkyl metal compound gases. Further, these embodiments can also be applied to the cases where thin films of metals such as chromium, iron, nickel, molybdenum, and tungsten are formed by a photo CVD apparatus using metal carbonyl compound gases. In other words, these embodiments can be applied to all cases where gases are decomposed by light so as to form thin films. In addition, these embodiments can be applied not only to a photo CVD apparatus, but also to a photo excited etching apparatus.

As described above, according to the present invention, a cassette-type carrier tray into which wafers to be processed and a light-penetrating window are united is carried into a carrier chamber. Thus, a decrease in the amount of incident light caused by adhesion of thin films to the light-penetrating window can be avoided. Moreover, a load-lock mechanism using plural chambers can be readily maintained. Thus, continuous batch processing can be realized, making a significant contribution to the mass production of amorphous silicon devices having a multi-layer configurations.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A photo chemical reaction apparatus for treating a workpiece with a reaction gas and light, comprising:
   a light source;
   movable carrier means for transporting workpieces to be photo chemically treated, including a carrier tray, having supporting means and a light-penetrating window for exposing a workpiece to the light source; and
   a processing vacuum container defining a reaction chamber for exposing the workpiece to the reaction gas and the light from the light source and a carrier chamber.

2. The apparatus of claim 1 wherein the processing vacuum container includes at least one gate valve for isolating from the outside of the processing vacuum container.

3. The apparatus of claim 1, wherein the processing vacuum container includes an opening between the carrier chamber and the reaction chamber, the carrier trays each being movable within the processing vacuum container for sealing the opening during exposure of the workpiece to the reaction gas and the light from the light source.

4. The apparatus of claim 1 wherein the supporting means includes a plurality of rods for spacing the workpiece from the window.

5. The apparatus of claim 3 wherein the processing container includes a partition defining the opening and each carrier tray includes a sealing plate extending therefrom for sealing the opening when the workpiece is moved into the reaction chamber.

6. The apparatus of claim 1 wherein the light-penetrating window is made of synthetic quartz.

7. The apparatus of claim 1 wherein the carrier tray includes two light-penetrating windows and two supporting means.

8. The apparatus of claim 1 wherein the light source includes a mercury-vapor lamp for emitting ultraviolet rays.

9. The apparatus of claim 1 wherein the light source includes a laser.

10. A photo chemical reaction apparatus for treating a workpiece with a reaction gas and light, comprising:
a light source;
movable carrier means for transporting workpieces to be photo chemically treated, including a plurality of carrier trays, each having supporting means and a light-penetrating window for exposing a workpiece to the light source;
transport vacuum container means for isolating the plurality of carrier trays from the atmosphere;
a processing vacuum container defining a reaction chamber for exposing the workpiece to the reaction gas and the light from the light source and a carrier chamber connected to the transport vacuum container means for receiving a carrier tray therefrom without exposure to the atmosphere; and
means for moving the carrier trays between the transport vacuum container and the carrier chamber.

11. The apparatus of claim 10 wherein the processing vacuum container includes at least one gate valve for isolating the transport vacuum container means from the carrier chamber.

12. The apparatus of claim 10 wherein the transport vacuum container means includes an elongated vacuum container having gear means therein, the plurality of trays including means interacting with the gear means for moving the trays along the vacuum container.

* * * * *